United States Patent
Oliaei et al.

(10) Patent No.: US 8,526,905 B2
(45) Date of Patent: Sep. 3, 2013

(54) MERGED FILTER-TRANSCONDUCTOR-UPCONVERTER

(75) Inventors: Omid Oliaei, Tempe, AZ (US); Julian Aschieri, Tempe, AZ (US)

(73) Assignee: Intel IP Corporation, Santa Clara, CA (US)

( * ) Notice: Subject to any disclaimer, the term of this patent is extended or adjusted under 35 U.S.C. 154(b) by 315 days.

(21) Appl. No.: 12/887,719

(22) Filed: Sep. 22, 2010

(65) Prior Publication Data

US 2012/0071111 A1 Mar. 22, 2012

(51) Int. Cl.
*H04B 1/26* (2006.01)

(52) U.S. Cl.
USPC .............................. 455/323; 455/118; 327/65

(58) Field of Classification Search
USPC .................. 455/118, 110, 112, 323; 327/355
See application file for complete search history.

(56) References Cited

U.S. PATENT DOCUMENTS

| | | | |
|---|---|---|---|
| 7,308,244 B2 * | 12/2007 | Chang et al. | 455/326 |
| 7,509,102 B2 * | 3/2009 | Rofougaran et al. | 455/127.1 |
| 2007/0262894 A1 * | 11/2007 | Nicollini et al. | 341/144 |
| 2010/0295597 A1 * | 11/2010 | Hsiao et al. | 327/355 |

* cited by examiner

*Primary Examiner* — Yuwen Pan
*Assistant Examiner* — Fatuma Sherif
(74) *Attorney, Agent, or Firm* — Baker Botts L.L.P.

(57) ABSTRACT

In accordance with embodiments of the present disclosure, a merged filter-transconductor-upconverter for use in a wireless communication device is provided.

22 Claims, 6 Drawing Sheets

MERGED FILTER-TRANSCONDUCTOR-UPCONVERTER

TECHNICAL FIELD

The present disclosure relates generally to wireless communication and, more particularly, to a merged filter-transconductor-upconverter for use in a wireless communication device.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

In traditional designs of wireless communications devices, the various functional blocks of such devices are often designed as separate circuits. For example, in many traditional designs a baseband filter and upconverter of a transmit path of a wireless communication device may exist as separate circuits. As so implemented, such components may require a relatively high power supply voltage, consume significant current, and may lead to distortion including counter-intermodulation (e.g., 4×BB distortion) due to non-linearity of components (e.g., non-linearity of a filtered baseband signal upconverted by an upconverter).

SUMMARY

In accordance with embodiments of the present disclosure, a merged baseband filter-transconductor-upconverter may include a baseband filter, a transconductance block, and an upconverter. The baseband filter may be configured to receive a differential voltage signal at its input, the differential voltage signal having a positive polarity and a negative polarity, and generate at its output a differential baseband filter output. The transconductance block may be configured to generate a positive polarity transconductance current signal and a negative polarity transconductance current signal, the positive polarity transconductance current signal proportional to the positive polarity of the differential voltage signal and the negative polarity transconductance current signal proportional to the negative polarity of the differential voltage signal. The upconverter may be configured to modulate the differential voltage signal and output a differential current signal at its output based on the differential baseband filter output, the differential current signal having a positive polarity and a negative polarity. The upconverter may include a first transistor, a second transistor, a third transistor, and a fourth transistor. The first transistor may be configured to, during a first phase of an oscillator signal, pass the positive polarity transconductance current signal to generate the positive polarity of the differential current. The second transistor may be configured to, during a second phase of an oscillator signal opposite of the first phase, pass the positive polarity transconductance current signal to generate the positive polarity of the differential current. The third transistor may be configured to, during the first phase, pass the negative polarity transconductance current signal to generate the negative polarity of the differential current. The fourth transistor configured to, during the second phase, pass the negative polarity transconductance current signal to generate the negative polarity of the differential current.

Technical advantages of one or more embodiments of the present disclosure may include a wireless communication element requiring smaller die area and requiring less power than traditional wireless communication elements.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
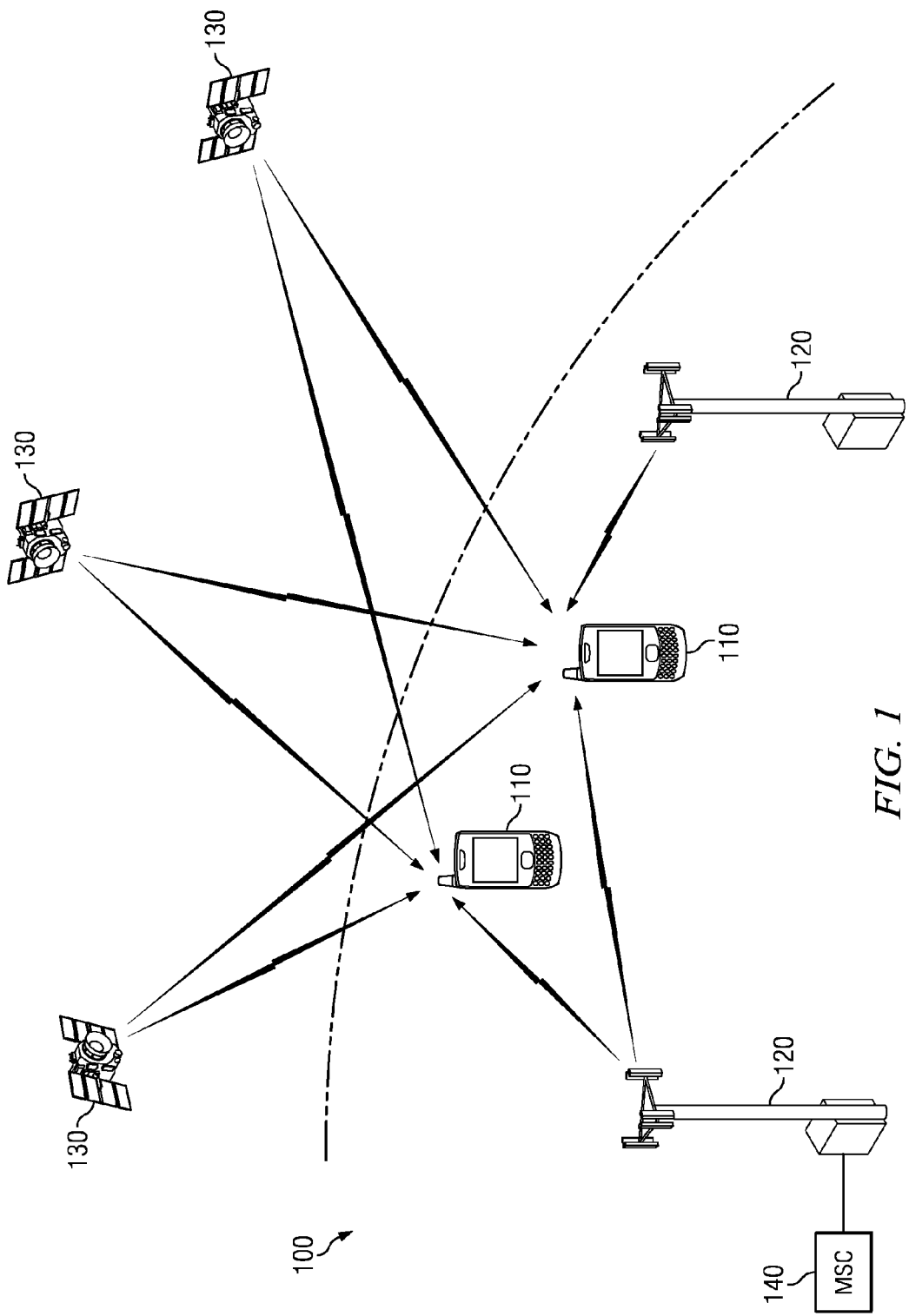
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
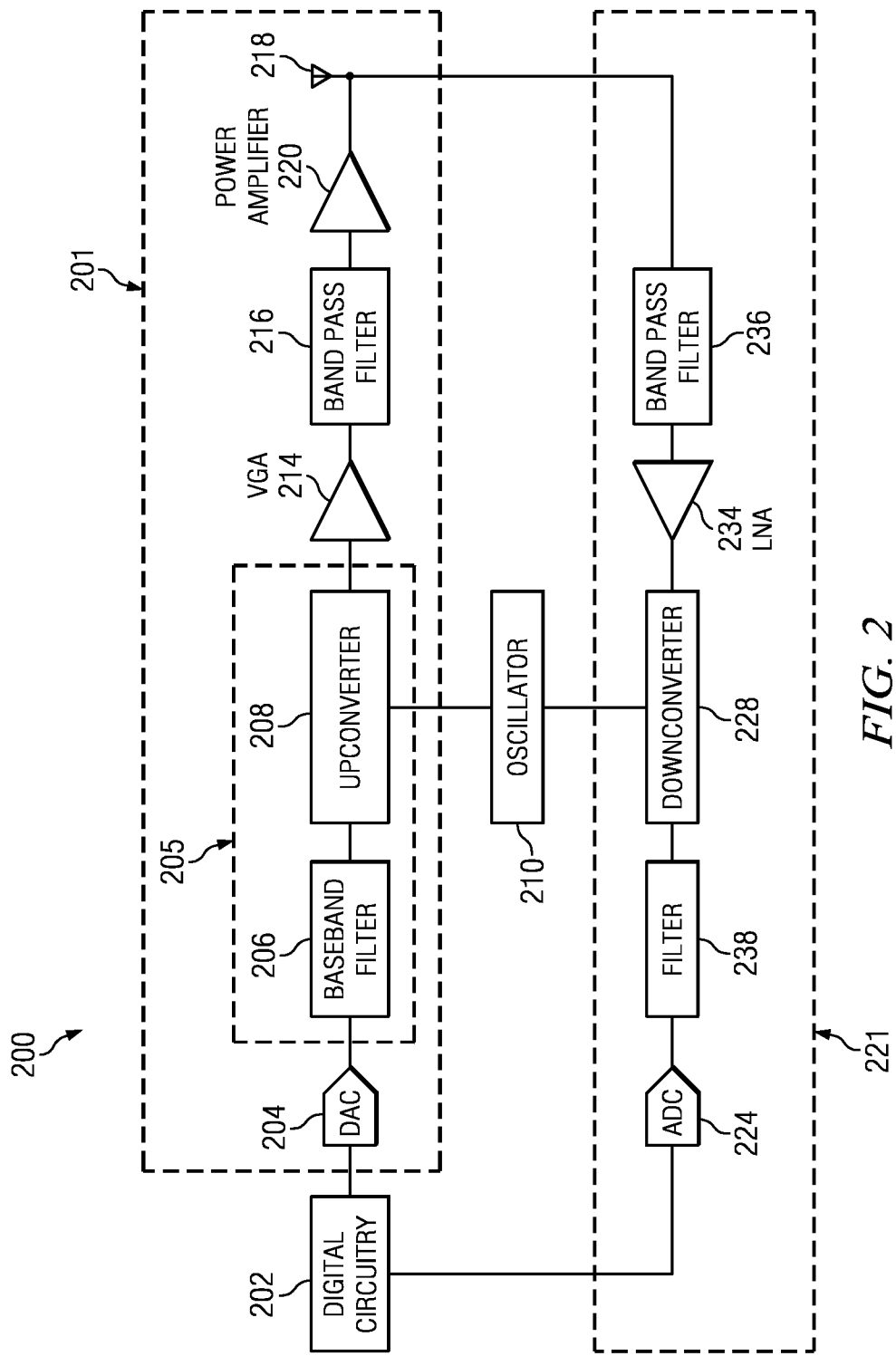
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may also include a digital-to-analog converter (DAC) 204. DAC 204 may be configured to receive a digital signal from digital circuitry 202 and convert such digital signal into an analog signal. Such analog signal may then be passed to one or more other components of transmit path 201, including baseband filter 206.

Baseband filter 206 may include any system, device or apparatus configured to pass low-frequency signals but attenuates signals with frequencies higher than a cutoff or baseband frequency. Thus, baseband filter 206 may receive an analog signal from DAC 204 and attenuate high-frequency components of such analog signal.

Upconverter 208 may be configured to frequency upconvert an analog signal received from baseband filter 206 to a wireless communication signal at a radio frequency based on an oscillator signal provided by oscillator 210. As indicated by FIG. 2, baseband filter 206 and upconverter 208 may be merged into a merged baseband filter-transconductor-upconverter 205. As its name indicates, in addition to performing functionality of baseband filter 206 and upconverter 208, merged baseband filter-transconductor-upconverter 205 may perform transconductance functionality, converting a voltage-mode signal received at its input to a current-mode signal at its output. Thus, merged baseband filter-transconductor-upconverter 205 may receive an unfiltered baseband voltage-mode signal at its input, filter the signal, convert the signal to current-mode, upconvert the current-mode signal to radio frequency, and output the upconverted current-mode signal. Merged baseband filter-transconductor-upconverter 205 is discussed in greater detail below with respect to FIGS. 3A-3C.

Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3A:
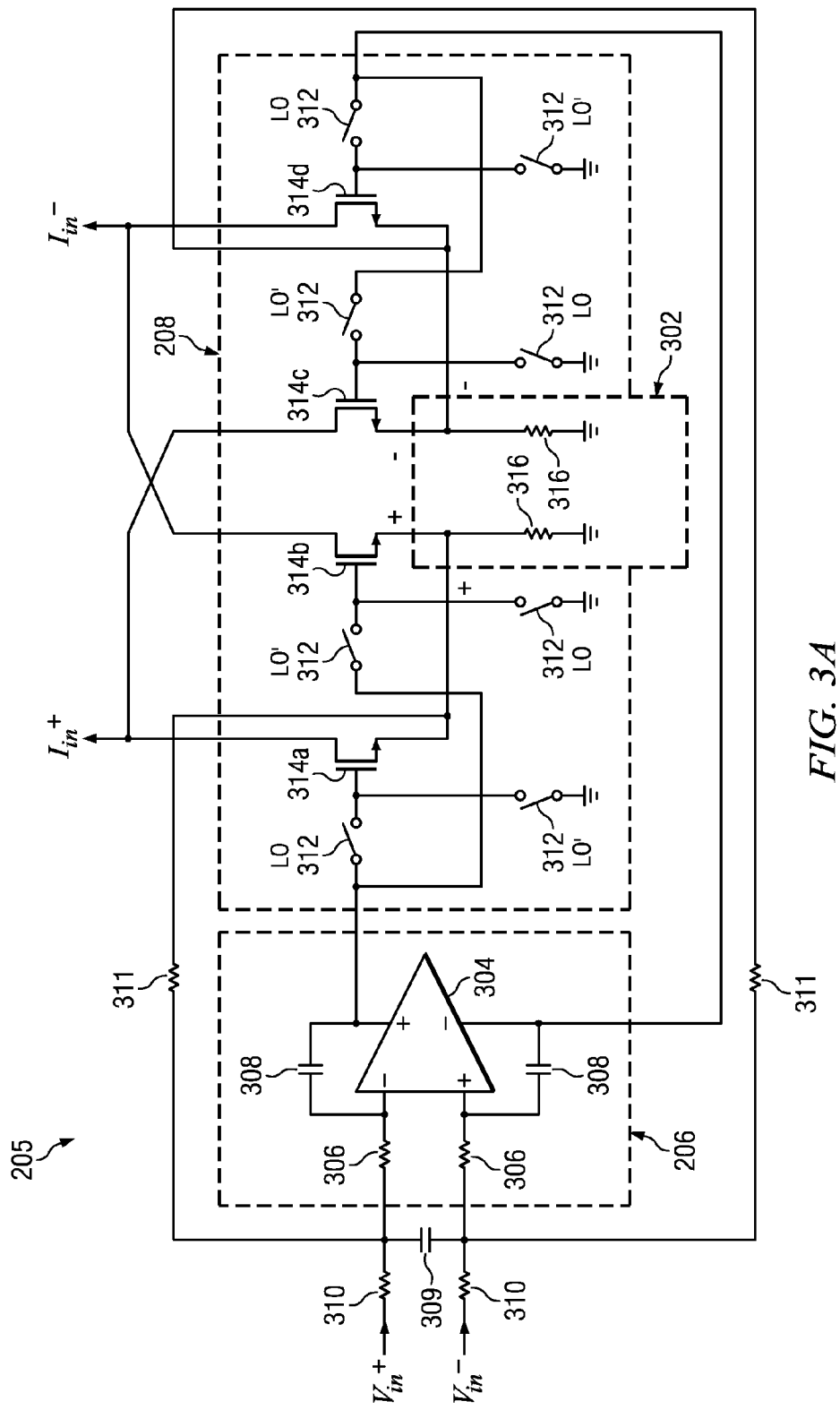
FIGS. 3A-3C illustrate diagrams of various embodiments of a merged baseband filter-transconductor-upconverter, in accordance with certain embodiments of the present disclosure.
Figure 3B:
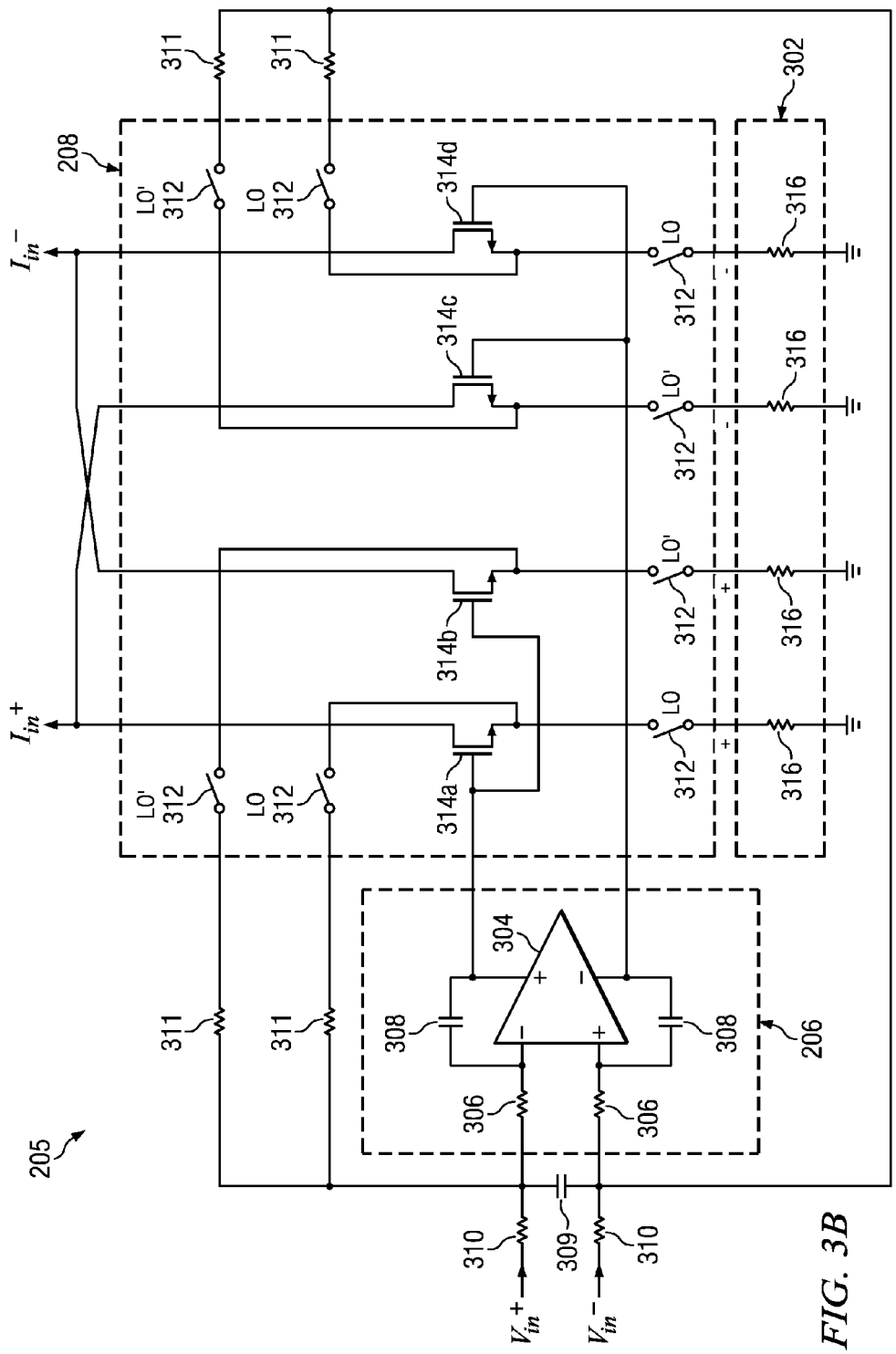
Figure 3C:
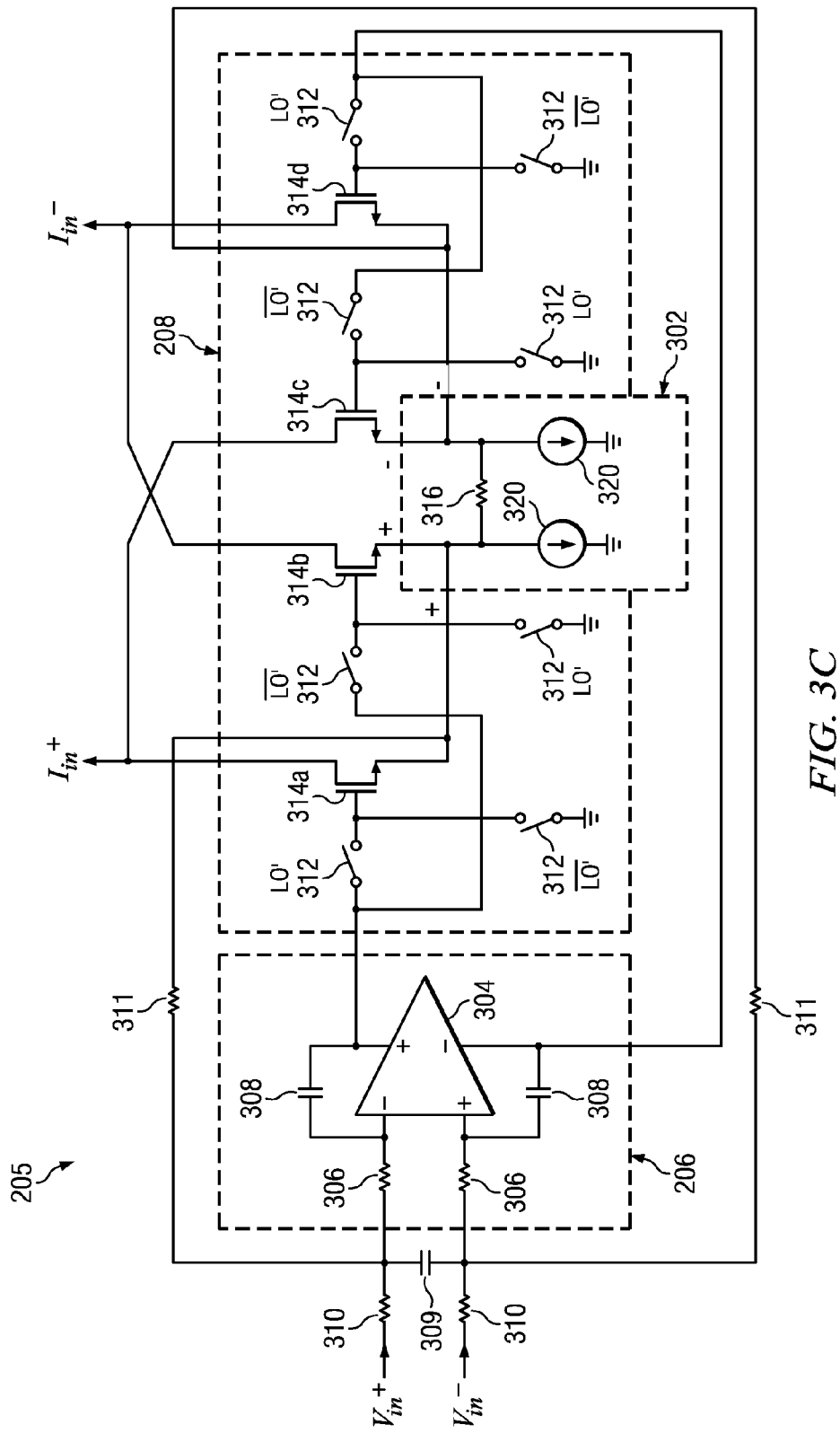

FIGS. 3A-3C illustrate diagrams of various embodiments of a merged baseband filter-transconductor-upconverter 205, in accordance with certain embodiments of the present disclosure. As shown in FIG. 3A, merged baseband filter-transconductor-upconverter 205 may include a baseband filter 206, upconverter 208, transconductance block 302, various coupling resistors 310 and 311, and a coupling capacitor 309. Merged baseband filter-transconductor-upconverter 205 may receive at its input a differential voltage signal, indicated in FIG. 3A by voltages $V_{in}^+$ and $V_{in}^-$. Each input of baseband filter 206 may be coupled to an input of merged baseband filter-transconductor-upconverter 205 via a coupling resistor 310. Each coupling resistor 310 may be selected such that its resistance, when combined with other components of merged baseband filter-transconductor-upconverter 205, provides a desired transfer function for baseband filter 206. In addition, the inputs of baseband filter 206 may be coupled together via a coupling capacitor 309. capacitor 309 may be selected such that its capacitance, when combined with other components of merged baseband filter-transconductor-upconverter 205, provides a desired transfer function for baseband filter 206 (e.g., filter the differential voltage signal as desired).

As depicted in FIG. 3A, baseband filter 206 may include a differential amplifier 304, a plurality of resistors 306, and a plurality of capacitors 308. Differential amplifier 304 may include any system, apparatus, or device configured to multiply the differential signal at its input by a constant factor and output the result at its output. As shown in FIG. 3A, differential amplifier 304 may have a differential output. Each resistor 306 may be coupled between an input of baseband filter 206 and a differential input of differential amplifier 304. Each capacitor may be coupled between a differential input of differential amplifier 304 having a first polarity and a differential output of differential amplifier having a second polarity opposite of the first polarity. In operation, these components of baseband filter 206 allow it to low-pass filter a differential signal received at its input, and output the filtered differential signal at its output. In the embodiment shown in FIG. 3A, baseband filter 206 is implemented as a Rauch filter. However, any other suitable filter structure may be used in place of the Rauch filter depicted in FIG. 3A.

As shown in FIG. 3A, upconverter 208 may include a plurality of switches 312 and a plurality of transistors 314. A switch 312 may be implemented in any suitable manner, including without limitation a switching circuit, one or more combinatorial gates, one or more p-type MOSFETs, one or more n-type MOSFETs, and/or one or more transmission gates.

Switches 312 may be driven by a local oscillator signal (LO) generated by an oscillator (e.g., oscillator 210), or the inverse of the local oscillator signal (LO'), as shown in FIG. 3A. Those switches 312 controlled by LO may close when LO is high (e.g., logic 1) allowing current to pass, and open when LO is low (e.g., logic 0) interrupting flow of current. Conversely, those switches 312 controlled by LO' may close when LO is low (e.g., logic 0) allowing current to pass, and open when LO is high (e.g., logic 1) interrupting flow of current. For the sake of simplicity, switches 312 are depicted as being controlled by a generic oscillator signal LO (or its inverse LO'). In actual implementation, a switch 312 may be controlled by either of the in-phase or quadrature components of an oscillator signal. Thus, in actual implementation, the structure of upconverter 208 depicted in FIG. 3A may be duplicated, such that one instance of such structure may upconvert based on an in-phase component of an oscillator, and the other instance of such structure may upconvert based on a quadrature components of an oscillator.

Transistors 314 (e.g., transistors 314a-d) may include any suitable transistor. Transistors 314 are depicted in the specific embodiment of FIG. 3A as n-type MOSFET transistors. Each transistor 314 may be configured such that its gate will receive a rail voltage (e.g., a ground voltage) during one phase of the oscillator signal LO, and receive one polarity of the differential output signal of baseband filter 206 during the other phase of oscillator signal LO. Each transistor 314 may also be configured such that it is coupled at its source to transconductance block 302 and coupled via resistor 311 to the input of a polarity of the differential input signal of baseband filter 206. Each transistor 314 may also be configured such that it is coupled at its drain to one polarity of the differential output of merged baseband filter-transconductor-upconverter 205.

Transconductance block 302 may include two resistors 316. Each resistor 316 may be coupled to the sources of two transistors 314, such that the sources of the two transistors 314 have a voltage proportional to the signal amplitude (e.g., alternating current (AC) voltage) at a polarity of the differential input signal of merged baseband filter-transconductor-upconverter 205, and such that neither resistor 316 is coupled to the same transistor 314.

In operation, during each phase of oscillator signal LO, one transistor 314 will pass a current to the positive polarity of the differential output of merged baseband filter-transconductor-upconverter 205, and another transistor 314 will pass a current to the negative polarity of the differential output of merged baseband filter-transconductor-upconverter 205. For example, while the oscillator signal LO is high, transistor 314a will pass a current that is a function of the signal amplitude (e.g., AC voltage) received at its gate (the positive polarity of the baseband filtered differential output baseband filter) and of the signal amplitude (e.g., AC voltage) present at its source (such source signal amplitude proportional to the positive polarity input signal $V_{in}^{+}$) divided by the resistance of a resistor 316 and transistor 314d will pass a current that is a function of the signal amplitude (e.g., AC voltage) received at its gate (the negative polarity of the baseband filtered differential output baseband filter) and of the signal amplitude (e.g., AC voltage) present at its source (such source signal amplitude proportional to the negative polarity input signal $V_{in}^{-}$) divided by the resistance of a resistor 316. In addition, while the oscillator signal LO is low, transistor 314b will pass a current that is a function of the signal amplitude (e.g., AC voltage) received at its gate (the positive polarity of the baseband filtered differential output baseband filter) and of the signal amplitude (e.g., AC voltage) present at its source (such source signal amplitude proportional to the positive polarity input signal $V_{in}^{+}$) divided by the resistance of a resistor 316 and transistor 314c will pass a current that is a function of the signal amplitude (e.g., AC voltage) received at its gate (the negative polarity of the baseband filtered differential output baseband filter) and of the signal amplitude (e.g., AC voltage) present at its source (such source voltage proportional to the negative polarity input signal $V_{in}^{-}$) divided by the resistance of a resistor 316. As a result, the differential input signal of merged baseband filter-transconductor-upconverter 205 may be modulated by the frequency of oscillator signal LO.

As shown in FIG. 3B, merged baseband filter-transconductor-upconverter 205 may include a baseband filter 206, upconverter 208, transconductance block 302, various coupling resistors 310 and 311, and a coupling capacitor 309. Merged baseband filter-transconductor-upconverter 205 may receive at its input a differential voltage signal, indicated in FIG. 3B by voltages $V_{in}^{+}$ and $V_{in}^{-}$. Each input of baseband filter 206 may be coupled to an input of merged baseband filter-transconductor-upconverter 205 via a coupling resistor 310. Each coupling resistor 310 may be selected such that its resistance, when combined with other components of merged baseband filter-transconductor-upconverter 205, provides a desired transfer function for baseband filter 206. In addition, the inputs of baseband filter 206 may be coupled together via a coupling capacitor 309. capacitor 309 may be selected such that its capacitance, when combined with other components of merged baseband filter-transconductor-upconverter 205, provides a desired transfer function for baseband filter 206 (e.g., filter the differential voltage signal as desired).

Baseband filter 206 of FIG. 3B may be similar or identical to baseband filter 206 of FIG. 3A. In the embodiment shown in FIG. 3B, baseband filter 206 is implemented as a Rauch filter. However, any other suitable filter structure may be used in place of the Rauch filter depicted in FIG. 3B.

As shown in FIG. 3B, upconverter 208 may include a plurality of switches 312 and a plurality of transistors 314. Switches 312 may be controlled by a local oscillator signal (LO) generated by an oscillator (e.g., oscillator 210), or the inverse of the local oscillator signal (LO'), as shown in FIG. 3B. Those switches 312 controlled by LO may close when LO is high (e.g., logic 1) allowing current to pass, and open when LO is low (e.g., logic 0) interrupting flow of current. Conversely, those switches 312 controlled by LO' may close when LO is low (e.g., logic 0) allowing current to pass, and open when LO is high (e.g., logic 1) interrupting flow of current. For the sake of simplicity, as in FIG. 3A switches 312 are depicted as being driven by a generic oscillator signal LO (or its inverse LO'). In actual implementation, a switch 312 may be controlled by either of the in-phase or quadrature components of an oscillator signal. Thus, in actual implementation, the structure of upconverter 208 depicted in FIG. 3B may be duplicated, such that one instance of such structure may upconvert based on an in-phase component of an oscillator, and the other instance of such structure may upconvert based on a quadrature components of an oscillator.

Each transistor 314 may be configured such that its gate is coupled to one polarity of the differential output signal of baseband filter 206. Each transistor 314 may also be configured such that it is coupled at its source to transconductance block 302 via a switch 312 and coupled via resistor 311 and a switch 312 to the input of a polarity of the differential input signal of baseband filter 206. Each transistor 314 may also be configured such that it is coupled at its drain to one polarity of the differential output of merged baseband filter-transconductor-upconverter 205.

Transconductance block 302 may include four resistors 316. Each resistor 316 may be coupled via a switch 312 to a source of a transistor 314, such that when a corresponding switch 312 is enabled, the sources of the transistor 314 have a voltage proportional to the signal amplitude (e.g., AC voltage) at a polarity of the differential input signal of merged baseband filter-transconductor-upconverter 205, and such that neither resistor 316 is coupled to the same transistor 314.

In operation, during each phase of oscillator signal LO, one transistor 312 will pass a current to the positive polarity of the differential output of merged baseband filter-transconductor-upconverter 205, and another transistor 312 will pass a current to the negative polarity of the differential output of merged baseband filter-transconductor-upconverter 205. For example, while the oscillator signal LO is high, transistor 314a will pass a current that is a function of the signal amplitude (e.g., AC voltage) received at its gate (the positive polarity of the baseband filtered differential output baseband filter) and of the signal amplitude (e.g., AC voltage) present at its source (such source signal amplitude proportional to the positive polarity input signal $V_{in}^+$) divided by the resistance of a resistor 316 and transistor 314d will pass a current that is a function of the signal amplitude (e.g., AC voltage) received at its gate (the negative polarity of the baseband filtered differential output baseband filter) and of the signal amplitude (e.g., AC voltage) present at its source (such source signal amplitude proportional to the negative polarity input signal $V_{in}^-$) divided by the resistance of a resistor 316. In addition, while the oscillator signal LO is low, transistor 314b will pass a current that is a function of the signal amplitude (e.g., AC voltage) received at its gate (the positive polarity of the baseband filtered differential output baseband filter) and of the signal amplitude (e.g., AC voltage) present at its source (such source signal amplitude proportional to the positive polarity input signal $V_{in}^+$) divided by the resistance of a resistor 316 and transistor 314c will pass a current that is a function of the signal amplitude (e.g., AC voltage) received at its gate (the negative polarity of the baseband filtered differential output baseband filter) and of the signal amplitude present at its source (such source signal amplitude proportional to the negative polarity input signal $V_{in}^-$) divided by the resistance of a resistor 316. As a result, the differential input signal of merged baseband filter-transconductor-upconverter 205 is modulated by the frequency of oscillator signal LO.

Figure 4:
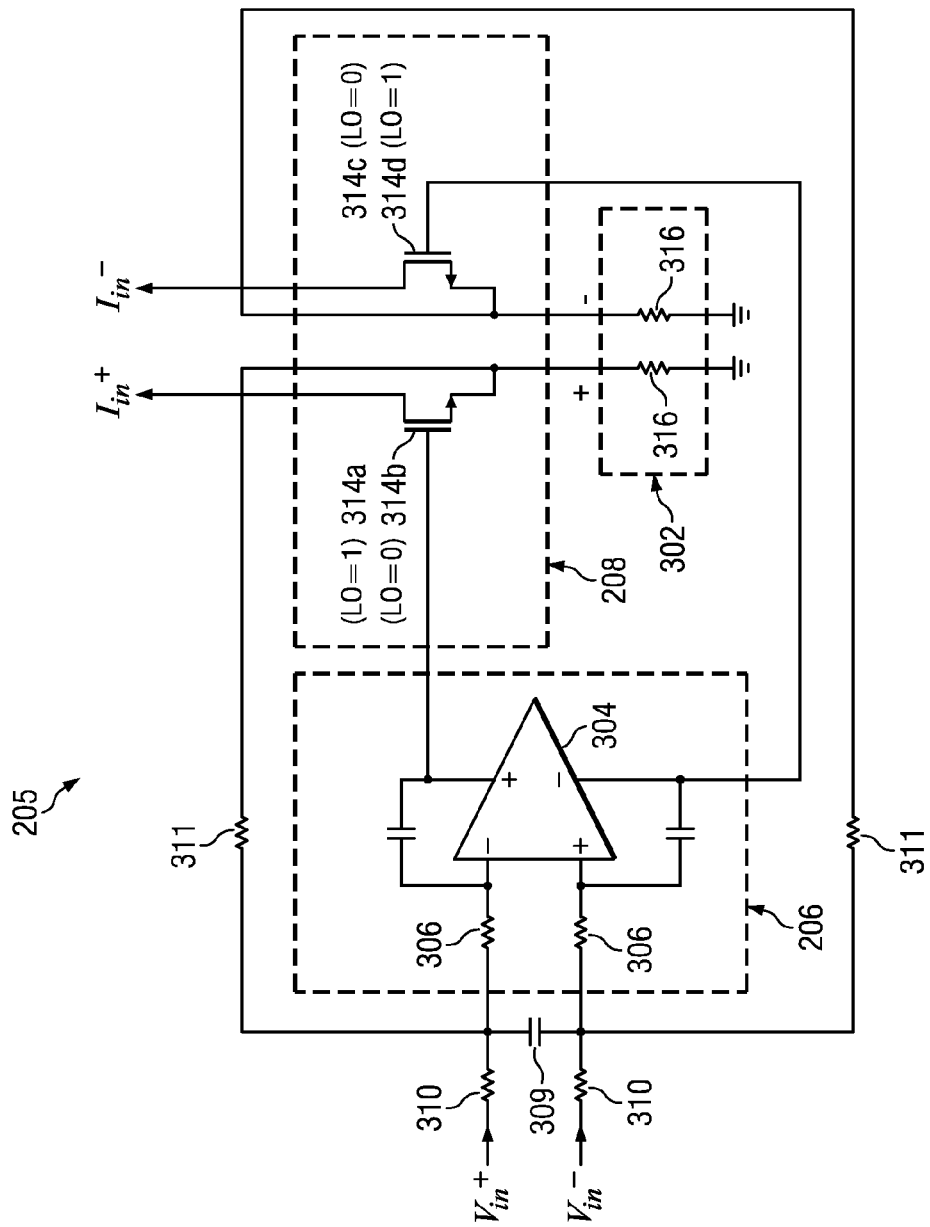
FIG. 4 illustrates an equivalent circuit diagram of the embodiments of the merged baseband filter-transconductor-upconverter depicted in FIGS. 3A and 3B, in accordance with certain embodiments of the present disclosure.

As a further illustration of the structure of the embodiments depicted in FIGS. 3A and 3B, FIG. 4 illustrates an equivalent circuit diagram of the embodiments of the merged baseband filter-transconductor-upconverter depicted in FIGS. 3A and 3B, in accordance with certain embodiments of the present disclosure.

FIG. 3C depicts yet another example embodiment for merged baseband filter-transconductor-upconverter 205. The embodiment depicted in FIG. 3C is similar to that of FIG. 3A, except that transconductance block 302 is modified. In FIG. 3C, transconductance block 302 includes a resistor 316 and current sources 320. Those of skill in the art will appreciate that operation of the embodiment depicted in FIG. 3C may be similar to the embodiment depicted in FIG. 3A.

Modifications, additions, or omissions may be made to system 100 from the scope of the disclosure. The components of system 100 may be integrated or separated. Moreover, the operations of system 100 may be performed by more, fewer, or other components. As used in this document, "each" refers to each member of a set or each member of a subset of a set.

Although the present disclosure has been described with several embodiments, various changes and modifications may be suggested to one skilled in the art. It is intended that the present disclosure encompass such changes and modifications as fall within the scope of the appended claims.

What is claimed is:

1. A merged baseband filter-transconductor-upconverter comprising:

a baseband filter configured to receive a differential voltage signal at its input, the differential voltage signal having a positive polarity and a negative polarity, and generate at its output a differential baseband filter output;

a transconductance block configured to generate a positive polarity transconductance current signal and a negative polarity transconductance current signal, the positive polarity transconductance current signal proportional to the positive polarity of the differential voltage signal and the negative polarity transconductance current signal proportional to the negative polarity of the differential voltage signal; and an upconverter configured to modulate the differential voltage signal and output a differential current signal at its output based on the differential baseband filter output, the differential current signal having a positive polarity and a negative polarity, the upconverter comprising:

a first transistor configured to, during a first phase of an oscillator signal, pass the positive polarity transconductance current signal to generate the positive polarity of the differential current;

a first switch interfaced between the positive polarity of the differential baseband filter output and the gate of the first transistor, the first switch configured to be closed during the first phase and open during the second phase;

a second transistor configured to, during a second phase of an oscillator signal opposite of the first phase, pass the negative polarity transconductance current signal to generate the positive polarity of the differential current;

a second switch interfaced between the negative polarity of the differential baseband filter output and the gate of the second transistor, the second switch configured to be open during the first phase and closed during the second phase;

a third transistor configured to, during the first phase, pass the negative polarity transconductance current signal to generate the negative polarity of the differential current;

a third switch interfaced between the negative polarity of the differential baseband filter output and the gate of the third transistor, the third switch configured to be closed during the first phase and open during the second phase;

a fourth transistor configured to, during the second phase, pass the positive polarity transconductance current signal to generate the negative polarity of the differential current; and a fourth switch interfaced between the positive polarity of the differential baseband filter output and the gate of the fourth transistor, the fourth switch configured to be open during the first phase and closed during the second phase.

2. A merged baseband filter-transconductor-upconverter according to claim 1, the baseband filter comprising a Rauch filter.

3. A merged baseband filter-transconductor-upconverter according to claim 1, the baseband filter comprising:

a differential amplifier having a differential input and the differential baseband filter output, the differential input and the differential baseband filter output each having a positive polarity and a negative polarity;

a first resistor configured to couple the positive polarity of the differential voltage signal to the negative polarity of the differential input;

a second resistor configured to couple the negative polarity of the differential voltage signal to the positive polarity of the differential input;

a first capacitor configured to couple the positive polarity of the differential input to the negative polarity of the differential baseband filter output; and a second capacitor configured to couple the negative polarity of the differential input to the positive polarity of the differential baseband filter output.

4. A merged baseband filter-transconductor-upconverter according to claim 1, wherein:

the first transistor is configured to, during the first phase, be coupled at its gate to the positive polarity of the differential baseband filter output and be coupled at its source to a first resistor of the transconductance block such that a voltage proportional to the positive polarity of differential voltage signal appears at the source of the first transistor and the first transistor generates the positive polarity of the differential current signal;

the second transistor is configured to, during the second phase, be coupled at its gate to the negative polarity of the differential baseband filter output and be coupled at its source to a second resistor of the transconductance block such that a voltage proportional to the negative polarity of differential voltage signal appears at the source of the second transistor and the second transistor generates the positive polarity of the differential current signal;

the third transistor configured to, during the first phase, be coupled at its gate to the negative polarity of the differential baseband filter output and be coupled at its source to the second resistor of the transconductance block or a third resistor of the transconductance block such that a voltage proportional to the negative polarity of differential voltage signal appears at the source of the third transistor and the third transistor generates the negative polarity of the differential current signal; and the fourth transistor configured to, during the second phase, be coupled at its gate to the positive polarity of the differential baseband filter output and be coupled at its source to the first resistor of the transconductance block or a fourth resistor of the transconductance block such that a voltage proportional to the positive polarity of differential voltage signal appears at the source of the fourth transistor and the fourth transistor generates the negative polarity of the differential current signal.

5. A merged baseband filter-transconductor-upconverter according to claim 4, wherein:

the positive polarity of the differential current signal generated by first transistor is a function of the positive polarity of the differential baseband filter output, the positive polarity of the differential voltage signal, and a resistance of the first resistor of the transconductance block;

the positive polarity of the differential current signal generated by second transistor is a function of the negative polarity of the differential baseband filter output, the negative polarity of the differential voltage signal, and a resistance of the second resistor of the transconductance block;

the negative polarity of the differential current signal generated by third transistor is a function of the negative polarity of the differential baseband filter output, the negative polarity of the differential voltage signal, and a resistance of the second resistor of the transconductance block or the third resistor of the transconductance block; and the negative polarity of the differential current signal generated by fourth transistor is a function of the positive polarity of the differential baseband filter output, the positive polarity of the differential voltage signal, and a resistance of the first resistor of the transconductance block or the fourth resistor of the transconductance block.

6. A merged baseband filter-transconductor-upconverter according to claim 1, comprising:

a fifth switch interfaced between the gate of the first transistor and a rail voltage, the fifth switch configured to be open during the first phase and closed during the second phase;

a sixth switch interfaced between the gate of the second transistor and a rail voltage, the sixth switch configured to be closed during the first phase and open during the second phase;

a seventh switch interfaced between the gate of the third transistor and a rail voltage, the seventh switch configured to be open during the first phase and closed during the second phase;

an eighth switch interfaced between the gate of the fourth transistor and a rail voltage, the eighth switch configured to be closed during the first phase and open during the second phase.

7. A merged baseband filter-transconductor-upconverter according to claim 6, wherein the rail voltage is a ground voltage.

8. A merged baseband filter-transconductor-upconverter comprising:

a baseband filter configured to receive a differential voltage signal at its input, the differential voltage signal having a positive polarity and a negative polarity, and generate at its output a differential baseband filter output;

a transconductance block configured to generate a positive polarity transconductance current signal and a negative polarity transconductance current signal, the positive polarity transconductance current signal proportional to the positive polarity of the differential voltage signal and the negative polarity transconductance current signal proportional to the negative polarity of the differential voltage signal; and an upconverter configured to modulate the differential voltage signal and output a differential current signal at its output based on the differential baseband filter output, the differential current signal having a positive polarity and a negative polarity, the upconverter comprising:

a first transistor configured to, during a first phase of an oscillator signal, pass the positive polarity transconductance current signal to generate the positive polarity of the differential current;

a first switch and a first resistor connected in series and interfaced between the negative polarity of the differential input and the source of the first transistor, the first switch configured to be closed during the first phase and open during the second phase;

a second transistor configured to, during a second phase of an oscillator signal opposite of the first phase, pass the negative polarity transconductance current signal to generate the positive polarity of the differential current;

a second switch and a second resistor connected in series and interfaced between the positive polarity of the differential input and the source of the second transistor, the second switch configured to be open during the first phase and closed during the second phase;

a third transistor configured to, during the first phase, pass the negative polarity transconductance current signal to generate the negative polarity of the differential current;

a third switch and a third resistor connected in series and interfaced between the positive polarity of the differential input and the source of the third transistor, the third switch configured to be closed during the first phase and open during the second phase;

a fourth transistor configured to, during the second phase, pass the positive polarity transconductance current signal to generate the negative polarity of the differential current; and a fourth switch and a fourth resistor connected in series and interfaced between the negative polarity of the differential input and the source of the fourth transistor, the fourth switch configured to be open during the first phase and closed during the second phase.

9. A merged baseband filter-transconductor-upconverter according to claim 8, further comprising:

a fifth switch and a fifth resistor connected in series and interfaced between the source of the first transistor and a rail voltage, the fifth switch configured to be closed during the first phase and open during the second phase;

a sixth switch and a sixth resistor connected in series and interfaced between the source of the second transistor and a rail voltage, the sixth switch configured to be open during the first phase and closed during the second phase;

a seventh switch and a seventh resistor connected in series and interfaced between the source of the third transistor and a rail voltage, the seventh switch configured to be closed during the first phase and open during the second phase; and a eighth switch and a eighth resistor connected in series and interfaced between the source of the fourth transistor and a rail voltage, the eighth switch configured to be open during the first phase and closed during the second phase.

10. The merged baseband filter-transconductor-upconverter according to claim 9, wherein the fifth resistor, sixth resistor, seventh resistor, and eighth resistor are components of the transconductance block.

11. The merged baseband filter-transconductor-upconverter according to claim 10, wherein the rail voltage is a ground voltage.

12. A wireless communication element, comprising a transmit path configured to convert a digital signal into a wireless communication signal based at least on an oscillator signal and transmit the wireless communication signal, the transmit path comprising:

an oscillator configured to generate an oscillator signal having a first phase and a second phase opposite of the first phase, and a merged baseband filter-transconductor-upconverter comprising:

a baseband filter configured to receive a differential voltage signal at its input, the differential voltage signal having a positive polarity and a negative polarity, and generate at its output a differential baseband filter output;

a transconductance block configured to generate a positive polarity transconductance current signal and a negative polarity transconductance current signal, the positive polarity transconductance current signal proportional to the positive polarity of the differential voltage signal and the negative polarity transconductance current signal proportional to the negative polarity of the differential voltage signal; and an upconverter configured to modulate the differential voltage signal and output a differential current signal at its output based on the differential baseband filter output, the differential current signal having a positive polarity and a negative polarity, the upconverter comprising:

a first transistor configured to, during a first phase of an oscillator signal, pass the positive polarity transconductance current signal to generate the positive polarity of the differential current;

a first switch interfaced between the positive polarity of the differential baseband filter output and the gate of the first transistor, the first switch configured to be closed during the first phase and open during the second phase;

a second transistor configured to, during a second phase of an oscillator signal opposite of the first phase, pass the negative polarity transconductance current signal to generate the positive polarity of the differential current;

a second switch interfaced between the negative polarity of the differential baseband filter output and the gate of the second transistor, the second switch configured to be open during the first phase and closed during the second phase;

a third transistor configured to, during the first phase, pass the negative polarity transconductance current signal to generate the negative polarity of the differential current;

a third switch interfaced between the negative polarity of the differential baseband filter output and the gate of the third transistor, the third switch configured to be closed during the first phase and open during the second phase;

a fourth transistor configured to, during the second phase, pass the positive polarity transconductance current signal to generate the negative polarity of the differential current; and a fourth switch interfaced between the positive polarity of the differential baseband filter output and the gate of the fourth transistor, the fourth switch configured to be open during the first phase and closed during the second phase.

13. A wireless element according to claim 12, the baseband filter comprising a Rauch filter.

14. A wireless element according to claim 12, the baseband filter comprising:

a differential amplifier having a differential input and the differential baseband filter output, the differential input and the differential baseband filter output each having a positive polarity and a negative polarity;

a first resistor configured to couple the positive polarity of the differential voltage signal to the negative polarity of the differential input;

a second resistor configured to couple the negative polarity of the differential voltage signal to the positive polarity of the differential input;

a first capacitor configured to couple the positive polarity of the differential input to the negative polarity of the differential baseband filter output; and a second capacitor configured to couple the negative polarity of the differential input to the positive polarity of the differential baseband filter output.

15. A wireless element according to claim 12, wherein:

the first transistor is configured to, during the first phase, be coupled at its gate to the positive polarity of the differential baseband filter output and be coupled at its source to a first resistor of the transconductance block such that a voltage proportional to the positive polarity of differential voltage signal appears at the source of the first transistor and the first transistor generates the positive polarity of the differential current signal;

the second transistor is configured to, during the second phase, be coupled at its gate to the negative polarity of the differential baseband filter output and be coupled at its source to a second resistor of the transconductance block such that a voltage proportional to the negative polarity of differential voltage signal appears at the source of the second transistor and the second transistor generates the positive polarity of the differential current signal;

the third transistor configured to, during the first phase, be coupled at its gate to the negative polarity of the differential baseband filter output and be coupled at its source to the second resistor of the transconductance block or a third resistor of the transconductance block such that a voltage proportional to the negative polarity of differential voltage signal appears at the source of the third transistor and the third transistor generates the negative polarity of the differential current signal; and the fourth transistor configured to, during the second phase, be coupled at its gate to the positive polarity of the differential baseband filter output and be coupled at its source to the first resistor of the transconductance block or a fourth resistor of the transconductance block such that a voltage proportional to the positive polarity of differential voltage signal appears at the source of the fourth transistor and the fourth transistor generates the negative polarity of the differential current signal.

16. A wireless element according to claim 15, wherein:

the positive polarity of the differential current signal generated by first transistor is a function of the positive polarity of the differential baseband filter output, the positive polarity of the differential voltage signal, and a resistance of the first resistor of the transconductance block;

the positive polarity of the differential current signal generated by second transistor is a function of the negative polarity of the differential baseband filter output, the negative polarity of the differential voltage signal, and a resistance of the second resistor of the transconductance block;

the negative polarity of the differential current signal generated by third transistor is a function of the negative polarity of the differential baseband filter output, the negative polarity of the differential voltage signal, and a resistance of the second resistor of the transconductance block or the third resistor of the transconductance block; and the negative polarity of the differential current signal generated by fourth transistor is a function of the positive polarity of the differential baseband filter output, the positive polarity of the differential voltage signal, and a resistance of the first resistor of the transconductance block or the fourth resistor of the transconductance block.

17. A wireless element according to claim 12, comprising:

a fifth switch interfaced between the gate of the first transistor and a rail voltage, the fifth switch configured to be open during the first phase and closed during the second phase;

a sixth switch interfaced between the gate of the second transistor and a rail voltage, the sixth switch configured to be closed during the first phase and open during the second phase;

a seventh switch interfaced between the gate of the third transistor and a rail voltage, the seventh switch configured to be open during the first phase and closed during the second phase;

an eighth switch interfaced between the gate of the fourth transistor and a rail voltage, the eighth switch configured to be closed during the first phase and open during the second phase.

18. A wireless element according to claim 17, wherein the rail voltage is a ground voltage.

19. A wireless communication element, comprising a transmit path configured to convert a digital signal into a wireless communication signal based at least on an oscillator signal and transmit the wireless communication signal, the transmit path comprising:

an oscillator configured to generate an oscillator signal having a first phase and a second phase opposite of the first phase, and a merged baseband filter-transconductor-upconverter comprising:

a baseband filter configured to receive a differential voltage signal at its input, the differential voltage signal having a positive polarity and a negative polarity, and generate at its output a differential baseband filter output;

a transconductance block configured to generate a positive polarity transconductance current signal and a negative polarity transconductance current signal, the positive polarity transconductance current signal proportional to the positive polarity of the differential voltage signal and the negative polarity transconductance current signal proportional to the negative polarity of the differential voltage signal; and an upconverter configured to modulate the differential voltage signal and output a differential current signal at its output based on the differential baseband filter output, the differential current signal having a positive polarity and a negative polarity, the upconverter comprising:

a first transistor configured to, during a first phase of an oscillator signal, pass the positive polarity transconductance current signal to generate the positive polarity of the differential current;

a first switch and a first resistor connected in series and interfaced between the negative polarity of the differential input and the source of the first transistor, the first switch configured to be closed during the first phase and open during the second phase;

a second transistor configured to, during a second phase of an oscillator signal opposite of the first phase, pass the negative polarity transconductance current signal to generate the positive polarity of the differential current;

a second switch and a second resistor connected in series and interfaced between the positive polarity of the differential input and the source of the second transistor, the second switch configured to be open during the first phase and closed during the second phase;

a third transistor configured to, during the first phase, pass the negative polarity transconductance current signal to generate the negative polarity of the differential current;

a third switch and a third resistor connected in series and interfaced between the positive polarity of the differential input and the source of the third transistor, the third switch configured to be closed during the first phase and open during the second phase;

a fourth transistor configured to, during the second phase, pass the positive polarity transconductance current signal to generate the negative polarity of the differential current; and a fourth switch and a fourth resistor connected in series and interfaced between the negative polarity of the differential input and the source of the fourth transistor, the fourth switch configured to be open during the first phase and closed during the second phase.

20. The wireless element according to claim 19, further comprising:

a fifth switch and a fifth resistor connected in series and interfaced between the source of the first transistor and a rail voltage, the fifth switch configured to be closed during the first phase and open during the second phase;

a sixth switch and a sixth resistor connected in series and interfaced between the source of the second transistor and a rail voltage, the sixth switch configured to be open during the first phase and closed during the second phase;

a seventh switch and a seventh resistor connected in series and interfaced between the source of the third transistor and a rail voltage, the seventh switch configured to be closed during the first phase and open during the second phase; and a eighth switch and a eighth resistor connected in series and interfaced between the source of the fourth transistor and a rail voltage, the eighth switch configured to be open during the first phase and closed during the second phase.

21. The wireless element according to claim 20, wherein the rail voltage is a ground voltage.

22. The wireless element according to claim 20, wherein the fifth resistor, sixth resistor, seventh resistor, and eighth resistor are components of the transconductance block.

* * * * *